(12) United States Patent
Busch-Sorensen

(10) Patent No.: US 6,621,357 B2
(45) Date of Patent: Sep. 16, 2003

(54) POWER OSCILLATOR FOR CONTROL OF WAVESHAPE AND AMPLITUDE

(75) Inventor: Thomas Busch-Sorensen, San Diego, CA (US)

(73) Assignee: Cubic Corporation, San Diego, CA (US)

(*) Notice: Subject to any disclaimer, the term of this patent is extended or adjusted under 35 U.S.C. 154(b) by 0 days.

(21) Appl. No.: 10/078,850

(22) Filed: Feb. 19, 2002

(65) Prior Publication Data

US 2002/0153961 A1 Oct. 24, 2002

Related U.S. Application Data

(60) Provisional application No. 60/269,341, filed on Feb. 16, 2001.

(51) Int. Cl.⁷ .................................................. H03L 7/00
(52) U.S. Cl. ........................ 331/36 C; 331/74; 327/178
(58) Field of Search ........................ 331/74, 117, 168, 331/100, 102, 140, 36 C; 327/178, 179, 180

(56) References Cited

U.S. PATENT DOCUMENTS

| | | | |
|---|---|---|---|
| 3,408,640 A | 10/1968 | Masson | 360/40 |
| 3,660,775 A | 5/1972 | Nechay | 331/57 |
| 3,873,928 A | 3/1975 | Lafuze | 328/14 |
| 4,311,921 A | 1/1982 | Dayton | 327/129 |
| 4,319,288 A | 3/1982 | Lee | 360/46 |
| 4,443,766 A | 4/1984 | Belton, Jr. | 328/151 |
| 4,635,143 A | 1/1987 | Suzuki et al. | 360/65 |
| 4,672,568 A | 6/1987 | Taylor | 364/721 |
| 4,786,989 A | 11/1988 | Okamura et al. | 360/65 |
| 4,816,830 A | 3/1989 | Cooper | 341/153 |
| 5,187,455 A | 2/1993 | Mandai et al. | 333/160 |
| 5,194,761 A | 3/1993 | Smith | 307/306 |
| 5,715,109 A | 2/1998 | Tanaka et al. | 360/65 |
| 5,739,707 A * | 4/1998 | Barraclough | 327/112 |
| H1773 H | 1/1999 | Cheston | 342/375 |
| 5,892,384 A * | 4/1999 | Yamada et al. | 327/277 |
| 6,026,125 A | 2/2000 | Larrick, Jr. | 375/295 |
| 6,161,762 A | 12/2000 | Bashan et al. | 235/492 |
| 6,452,428 B1 * | 9/2002 | Mooney et al. | 327/108 |

* cited by examiner

Primary Examiner—Tuan T. Lam
Assistant Examiner—Hiep Nguyen
(74) Attorney, Agent, or Firm—Brown, Martin, Haller & McClain, LLP

(57) ABSTRACT

An RF power oscillator for contactless card antennas shapes a carrier signal at the operating frequency utilizing a delay circuit having a number of taps for delaying the carrier signal by different lengths of time. The delayed signals are input into a buffer and output through resistors to a node coupled to the antenna. The resulting waveform for a square wave input signal, and equal-length delay taps, is a trapezoidal wave output. Any input wave form can be shaped in a variety of ways depending upon the combinations of delay taps used. Since the buffer drivers for each delayed wave switch state at slightly different times, the amplitude and bandwidth of emitted electromagnetic interference (EMI) is reduced for the transmission circuit.

19 Claims, 3 Drawing Sheets

POWER OSCILLATOR FOR CONTROL OF WAVESHAPE AND AMPLITUDE

CROSS-REFERENCES TO RELATED APPLICATIONS

This application claims the benefit of priority of U.S. provisional application Ser. No. 60/269,341 filed Feb. 16, 2001 which is incorporated herein by reference in its entirety.

BACKGROUND OF THE INVENTION

1. Field of Invention

This invention relates generally to radio frequency (RF) power oscillators for contactless card antennas, and more specifically to an RF power oscillator utilizing tapped delay lines and digital buffers for shaping the operating frequency input signal to minimize unwanted harmonics and reduce electromagnetic interference.

2. Background

Smart card signal transmission circuitry includes at least one oscillator circuit for generating a modulated carrier signal for transmission of data to a smart card. A common class of output stage utilized for RF communication is Class-A output stages which is capable of generating pure sine waves due to its linear characteristics. Due to the low efficiency of the Class-A output stages, non-linear power stages or square wave generators are typically used in the prior art as the radio frequency (RF) power oscillators for contactless card antennas. However, these non-linear or square wave generators present several disadvantages for use in providing a modulated carrier signal for transmission by smart card antennas.

A disadvantage of the prior art nonlinear transistor stage is the dependency on the transistors gain parameters. This type of output stage is typically based on a NPN transistor with a parallel LC resonance circuit as collector load. This circuit is capable of generating fairly pure sine waves, but the nonlinear nature of the circuit makes it very hard to control the amplitude of the output signal and especially the modulation index in case amplitude modulation is desired.

A disadvantage of the prior art square wave generator is that the generator draws a large current spike from the power supply when it switches state due to the charging and discharging of inherent capacitances in the switching circuit. The current spike typically has a duration comparable to the rise and fall-time of the output square wave, resulting in a current spike with a very broad electromagnetic interference (EMI) noise spectrum. The prior art circuits that use the nonlinear or square wave generator also require the use of a low pass or a band pass filter before the modulated signals are fed to the tuned antenna coil to rid the signal of the harmonics of the operating frequency. However, these filters include combinations of capacitors and inductors which produce additional signal interference between the filter and the tuned antenna coil resulting in unwanted resonances at frequencies outside the operating frequency of the smart card communication system.

Therefore, a need continues to exist for a radio frequency power oscillator for use with contactless smart card antennas that will produce a high current, modulated signal with an improved wave shape and accurately controlled amplitude without drawing excessive current spikes and with reduced electromagnetic interference.

SUMMARY OF THE INVENTION

It is an advantage of the present invention to provide a power oscillator circuit for control of the wave-shape and the amplitude of an output data signal.

It is another advantage to provide a high current/low impedance modulated output signal for use with a smart card antenna.

Still another advantage is to provide an RF power circuit having low electromagnetic interference.

It is yet another advantage that the amplitude and modulation index is accurately controlled by the supply voltage of the output stage.

In the exemplary embodiment of the present invention a power oscillator circuit generates a wave-shaped and amplitude controlled output signal for transmission on a smart card antenna. The power oscillator includes an on/off modulated carrier input signal connected to a tapped delay line. Multiple tap outputs of the delay line are connected to the inputs of a selected number of buffers. The outputs of the buffers are connected in series with same value resistors, and the buffer output resistor lines are connected in parallel to a single node. The progressively delayed input signals on the buffer output resistor lines are hard-wire combined at the single node to produce a wave-shaped output signal. For a square wave carrier input signal having a 50% duty cycle, and a tapped delay line have equal-length delay taps, the resulting wave-shaped output signal is trapezoidal with a rise and fall time equal to the number of taps multiplied by the delay time between taps. In other embodiments of the invention, the power oscillator may be configured to generate a different output signal depending upon the configurations of delay taps used. Since the buffer drivers for each delayed output signal switch state at slightly different times, the amplitude and bandwidth of emitted electromagnetic interference (EMI) is reduced significantly.

The power oscillator of the present invention also offers the advantage of control of the amplitude of the wave-shaped output signal for amplitude modulation of less than 100%. The exemplary embodiment provides 0–25% modulation utilizing a power supply circuit which outputs a desired transmission voltage. These modulation percentages are used in the particular applications for smart card antennas as specified in the ISO14443 standard. As an example, an ISO14443 type-B contactless smart card requires a modulation index of 10%. This is achieved in the present invention by switching between a supply voltage of Vmean+10% and Vmean−10%. If Vmean+10% is 5.0V, then Vmean equals 5V1.10, and Vmean−10% equals 0.90×(5V/1.10), or 4.09V. The transmission voltage generated by the power supply circuit is connected to the power supply inputs of the buffers. The buffers output signals are then limited to the voltage amplitude of the power input to the buffers resulting in the desired 10% modulation index amplitude modulation. The maximum modulation index is limited by the minimum operating voltage of the buffers.

In an exemplary method of the present invention for controlling the wave shape and amplitude of a modulated carrier signal, the modulated carrier signal is produced utilizing a power oscillator circuit which includes readily available, low cost CMOS line drivers as the RF power source. Each line driver is a 74AC541 driver manufactured by Texas Instruments, or any other suitable line driver, which has eight individual buffers. The exemplary embodiment utilizes a total of three line drivers. Two of the buffers of the first line driver are used for driving the delay line, and two of buffers of the third line driver are used for driving the termination of the delay line to either 2.5 v or 0.0 v to conserve energy in idle mode. Therefore, there are twenty buffers available for connection to the twenty taps of the tapped delay line. A square wave signal at the operating frequency and with 50% duty cycle drives the inputs of the CMOS line drivers. If 100% AM modulation is required, the data signal input will be gated digitally, preferably synchronized to the operating frequency. If 0 to 25% modulation is required, the supply voltage for the CMOS line drivers is modulated accordingly by the power supply circuit. The outputs of the CMOS line drivers are connected in parallel with a 82 ohm resistor in series with the output of the CMOS line drivers. This value is chosen in order to minimize the influence of variations in buffer output impedance. If the typical output impedance of the buffer is 25 ohm with a tolerance of +/−50%, then the apparent output impedance tolerance of each buffer will be reduced to +/-12% if 82 ohm 1% resistors are added to the output. The value of the resistors for other embodiments may range from 22 ohms to 100 ohms in accordance with the typical output impedance of the buffers.

The inputs of the CMOS line drivers are connected to the tapped delay-line having equal length delays between the inputs of the CMOS line drivers. The signal will typically travel at a speed of less than 200 mm/ns in a buried stripline. The length of the delay line between each tap is approximately 112 mm. In the exemplary embodiment of the present invention, the tapped delay trace is a buried stripline on a 6 layer printed circuit board. The stripline runs in layer 4, and layer 2 and 6 are ground planes on each side of the stripline. The width of the stripline is approximately 0.2 mm, and spacing between each stripline is approximately 0.2 mm. This results in an impedance of approximately 75 ohms, and a delay of approximately 180 mm/ns. The resulting trapezoidal wave has a rise and fall time of approximately 12.5 ns.

The output of the twenty paralleled resistors is lowpass filtered with a 1200 pF capacitor, C3, to ground. The resulting output impedance of the power oscillator, at node 108, 110 is approximately (25+82)/20 ohm=5 ohm in parallel with 1200 pF, or approximately 3.3 ohm at 13.56 MHz. This is sufficiently low for driving a parallel tuned antenna through a capacitive network, without loading the Q factor of the tuned circuit excessively. As the impedance of the node 108, 110 is very low, the tuned circuit C1, L1 effectively has C2 connected in parallel to ground. C2 and C1 will typically have a value of 220 pF.

The point in time where each individual buffer switches is distributed over a period equal to the resulting rise time of the output wave form, resulting in a transient current draw from the power supply that is distributed in time as well. If for example, twenty (20) buffers are used, the resulting transient current draw can be twenty (20) times lower and spread over a twenty (20) times longer period, compared to a system where all buffers switch at the same time. This reduces the amplitude and bandwidth of the resulting emitted EMI from the circuit considerably.

BRIEF DESCRIPTION OF THE DRAWINGS

The present invention will be better understood from the following detailed description of a preferred embodiment of the invention, taken in conjunction with the accompanying drawings in which like reference numerals refer to like parts and in which.

DESCRIPTION OF THE PREFERRED EMBODIMENT

The following detailed description utilizes a number of acronyms which are generally well known in the art. While definitions are typically provided with the first instance of each acronym, for convenience, Table 1 below provides a list of the acronyms and abbreviations and their respective definitions.

| ACRONYM | DEFINITION |
| --- | --- |
| AC | alternating current |
| AM | amplitude modulation |
| CMOS | complementary metal-oxide semiconductor |
| RF | radio frequency |

Figure 1:
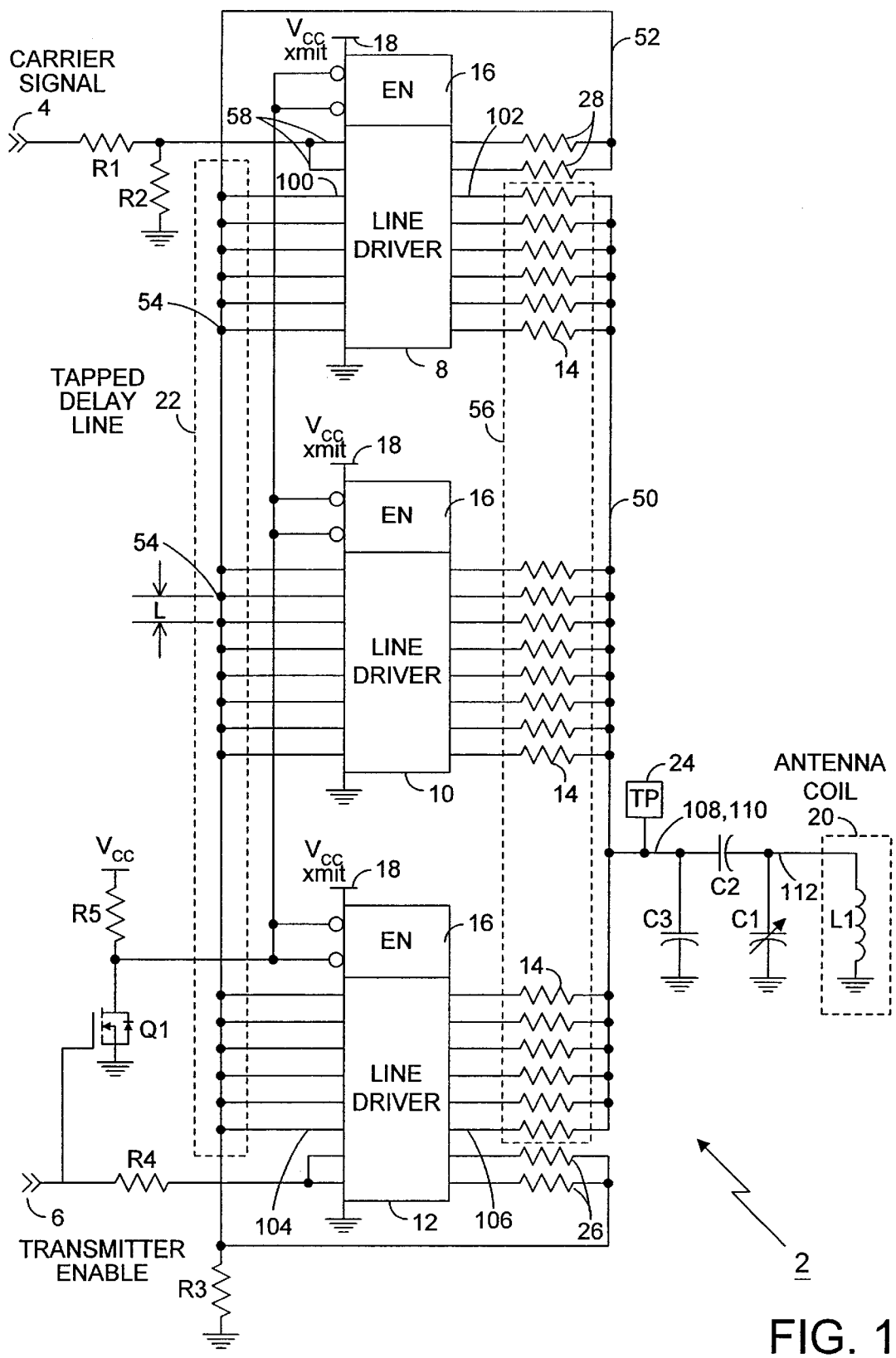
FIG. 1 is an block diagram of the power circuitry for control of signal wave shape and amplitude of a preferred embodiment.

FIG. 1 illustrates a RF power oscillator circuit 2 of a preferred embodiment for the control of the wave shape and the amplitude of a carrier signal 4. The RF power oscillator circuit 2 includes a carrier signal 4 coupled to a tapped delay line 22, line drivers 8, 10, 12 having multiple inputs, a tap 54 for connection to the inputs of the line drivers 8, 10, 12, line driver enable circuitry Q1, R5, R4, line driver output resistors 14, 26, 28 and an output capacitive network C1, C2, C3 coupled to an antenna coil 20. The operating voltages $V_{CC}$ and $V_{CC}$ transmit 18 are supplied by a supply voltage control circuit 40 illustrated in FIG. 2.

Continuing with FIG. 1, the carrier signal 4 of the preferred embodiment is a square wave at the operating frequency, e.g. 13.56 MHz, with a 50% duty cycle. If 100% AM modulation is required, a data signal input (not shown) will be gated digitally, preferably synchronized to the operating frequency, to produce a modulated carrier signal 4. If 0 to 25% modulation is required, a $V_{CC}$ transmit voltage input 18 of the line drivers may be modulated accordingly by the supply voltage control circuit 40 of FIG. 2.

As shown in FIG. 1, The modulated carrier signal 4 is input to the line driver 8 through resistors R1 and R2 which serve to limit the amplitude of the modulated carrier signal 4 in order not to exceed the maximum input voltage specifications of the line driver 16. The line drivers 8, 10, 12 of the preferred embodiment are low cost and readily available complementary metal-oxide semiconductor (CMOS) line drivers such as the octal buffer/line drivers, part number 74AC541, manufactured by Texas Instruments. The line drivers 8, 10, 12 typically are arranged in packages of eight individual drivers. The outputs of the CMOS line drivers 8, 10, 12 are connected in parallel to a single output node 50. In the preferred embodiment, each line driver output 102, 106 is connected in series with a resistor 14 to limit the output current of the driver and control the output impedance. The resistors 14 of the preferred embodiment are of equal resistance of 82 ohms to ensure that the driver outputs 102, 106 have the same electrical characteristics. For a 74AC541 buffer driver, the resistor values may range from 22 ohms to 100 ohms. If the values is too low, the variances in output impedance of the drivers becomes dominant, and if the value is too high, the output power of the circuit will be limited.

As shown in the preferred embodiment of FIG. 1, the modulated input signal 4 is coupled to the first two inputs 58 of a first buffer 8. The corresponding buffer output lines are connected in parallel through series resistors 28 to a single node 52. The single node 52 serves as the input to the tapped delay line 22. In the preferred embodiment, series resistors 28 have a value of 4.7 ohms to ensure that the load is evenly distributed between the two buffers. The buffer enable lines are connected to the enable circuitry 6, Q1, R5. Q1 acts as an inverter for the "TRANSMITTER ENABLE" signal.

The inputs 100 of the CMOS line drivers 8, 10, 12 are connected to the tapped delay-line 22. In a preferred embodiment of the invention, the individual delays between the inputs 100 of the CMOS line drivers 8, 10, 12 are equal. This configuration results in an output signal 108 signal having a trapezoidal wave shape. A more complex delay distribution may be utilized to produce a desired wave shape, for example, a sine wave shape. The tapped delay line 22 of the preferred embodiment is constructed using a stripline path embedded in a printed circuit board with a distance L between each tap 54. In other embodiments of the invention, a conventional delay line circuit may be used such as a delay IC or a LC delay line.

The delayed output signals 102 of the preferred embodiment ensure that all of the buffers of the line drivers 8, 10, 12 switch at different points in time over a period equal to the resulting rise time of the output wave form. The distributed switching of the buffers of the line drivers 8, 10, 12 results in a transient current draw from the power supply circuit 40 that is distributed in time as well. If, for example, twenty buffers are used for shaping the output waveform 108, the resulting transient current draw is twenty times lower and spread over a twenty times longer period as compared to a system where all buffers switch at the same time. Thus, the RF power circuitry 2 of the preferred embodiment considerably reduces the amplitude and bandwidth of the resulting emitted EMI from the circuit 2.

Figure 2:
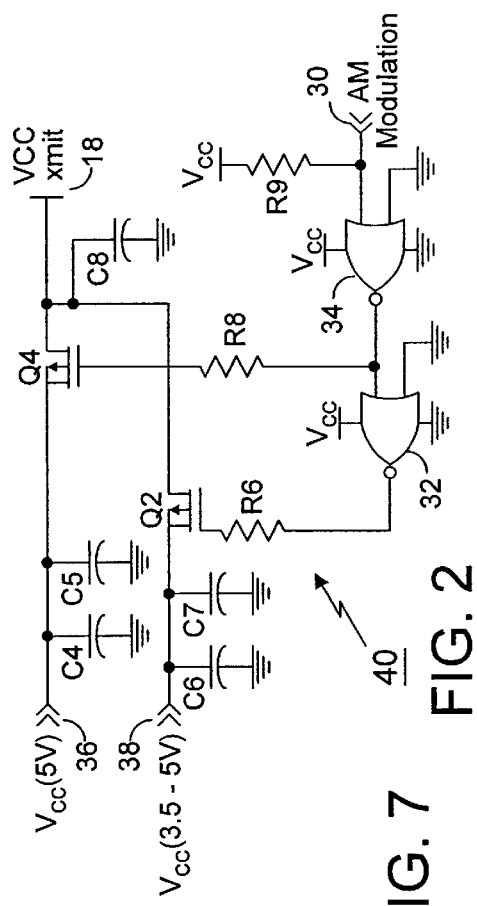
FIG. 2 is a block diagram of a voltage control circuit of a preferred embodiment.
Figure 7:
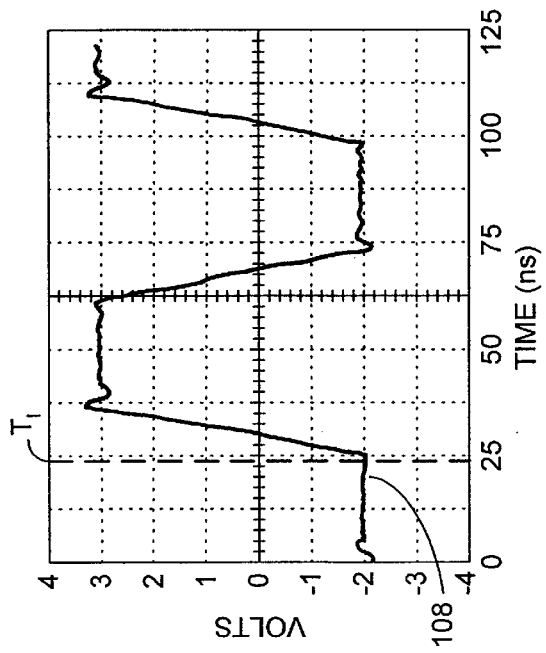
FIG. 7 illustrates a waveform of the output signal of the paralleled buffers without capacitive/antenna loading.

FIG. 2 is an illustration of the supply voltage control circuit 40 for amplitude modulation of 0% to 25%. The $V_{CC}$ transmit voltage output 18 of this circuit may be controlled to provide a required amplitude of the output signal 108, 110. The power supply circuit of the preferred embodiment includes a $V_{CC}$ power supply of 5 volts connected to the source of a P-channel field-effect transistor (FET) Q4. When the high value of the amplitude modulation is desired, the FET Q4 is switched on, and when low value of the amplitude modulation is desired, the P-channel FET Q2 is switched on. Capacitors C4 and C5 are decoupling capacitors for the 5V supply and C6 and C7 are decoupling capacitors for the 3.5–5V supply. Typical values are 0.1 uF and 10 uF. Capacitor C8 is a decoupling capacitor for the Vccxmit node. The CMOS inverter 34 ensures that the control signal 30 swings between 0 and 5V, and the inverter 32 inverts the signal 30, so that Q2 and Q4 are never switched on at the same time. Resistors R6 and R8 limit the rise time of Q2 and Q4, respectively, so that the drain current is limited to safe values when Q2 and Q4 switch state. FET Q2 is coupled as a source follower. The voltage at Vccsmit 18 will always be equal to or larger than the voltage at Vcc(3.5–5V) 38, so the intrinsic diode from drain to source in Q2 will never conduct.

In a method for controlling wave shape and amplitude of an carrier signal for transmission by a smart card antenna, an RF power oscillator utilizes three 74AC541 line drivers 8, 10, 12 having eight buffers each. Two of the line buffers of the first line driver 8 are used for driving the tapped delay line 22. The last two buffers of the third line driver 12 are used by the enable circuitry 6, R4 for driving the termination of the delay line to either 2.5 v or 0.0 v to conserve energy in idle mode. The tapped delay line 22 uses the remaining twenty taps for shaping the output waveform 108.

The length L of the delay line between each tap is approximately 112 mm. The traces of the tapped delay line 22 are implemented as a buried stripline on a layered printed circuit board (not shown). The stripline is placed in an inner layer and is located between two ground plane layers. The width of the stripline is approximately 0.2 mm and the spacing between each stripline is approximately 0.2 mm. This configuration of the stripline has a line impedance of approximately 75 ohm with a delay of approximately 0.6 ns between taps.

Figure 3:
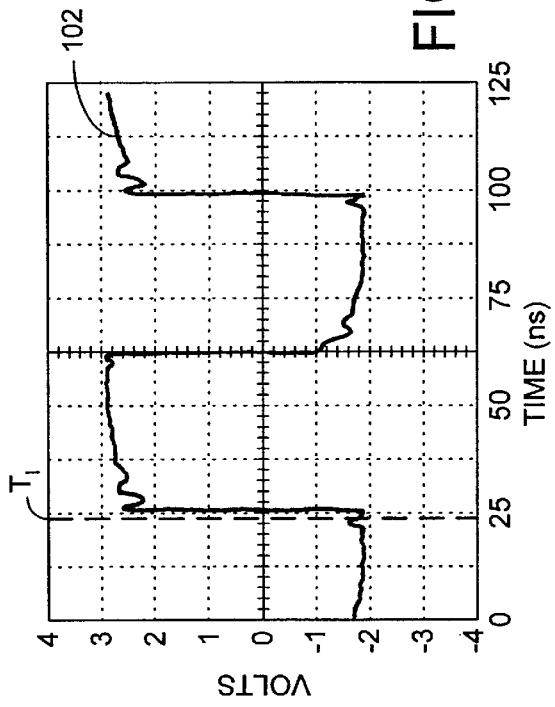
FIG. 3 illustrates a waveform of a square wave input signal to a first buffer along the tapped delay line.
Figure 4:
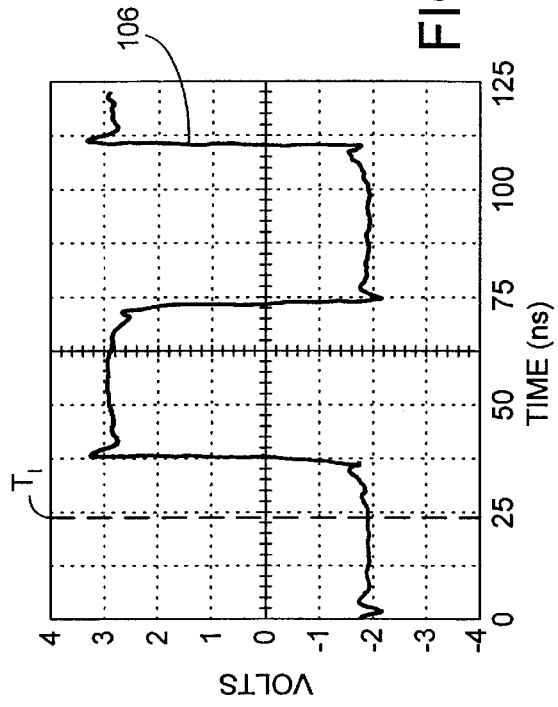
FIG. 4 illustrates a waveform of the output signal of the first buffer.
Figure 5:
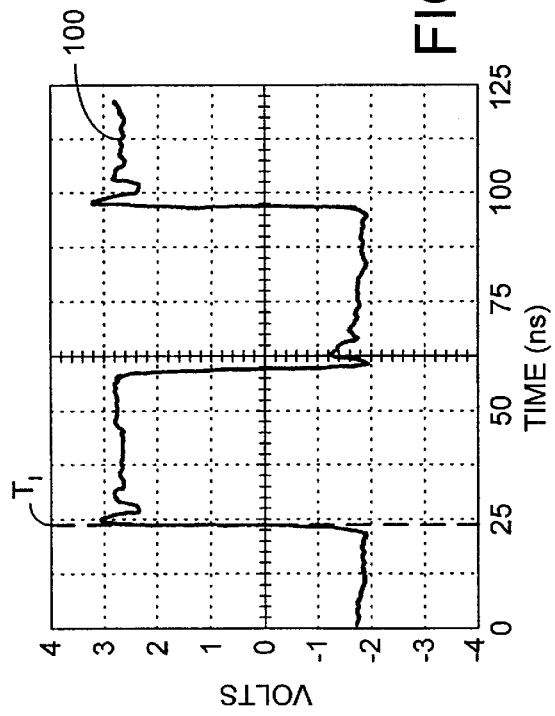
FIG. 5 illustrates a waveform of a delayed square wave input to a last buffer along the tapped delay line.
Figure 6:
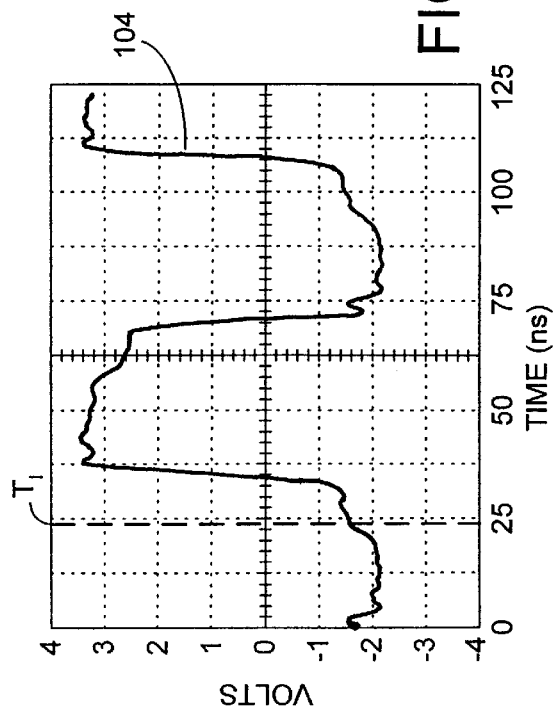
FIG. 6 illustrate a waveform of the output of the last buffer.

FIGS. 3 through 9 illustrate the input and output signals for the RF power circuit 2 of the preferred method for controlling the wave shape and amplitude of a carrier signal. FIG. 3 is an illustration of a square wave input signal 100 at the first tap of the tapped delay line 22. FIG. 4 illustrates the first buffer output 102 of the first tap of the tapped delay line 22. The first buffer output 102 is delayed due to the input-to-output delay of the line driver 8. FIG. 5 is an illustration of the square wave input signal 104 at the last tap of the tapped delay line 22, and FIG. 6 is an illustration of the last buffer output 106 of the last tap of the tapped delay line 22. A comparison of FIG. 4 and FIG. 6 demonstrates that the last buffer output signal 106 is delayed by approximately 12.5 ns from the first buffer output signal 102. The resulting trapezoidal signal 108, shown in FIG. 7 and measured at test point 24 of FIG. 1, has a rise and fall time of approximately 12.5 ns.

Figure 8:
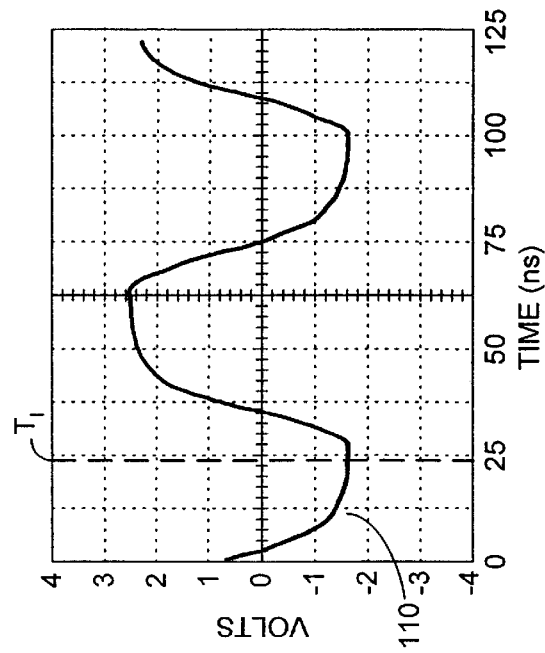
FIG. 8 illustrates a waveform of the output signal of the paralleled buffers with capacitive loading from C3.
Figure 9:
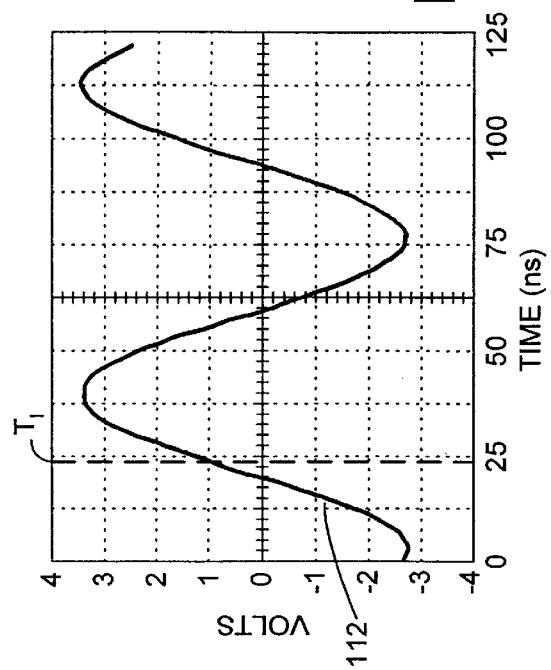
FIG. 9 illustrates a waveform of the output signal on a tuned one-turn antenna coil.

When capacitive loading C3 is added to the output node 50 of the RF power circuit 2, the filtered output 110 of FIG. 8 is produced. In the preferred embodiment, the capacitive loading includes a 1200 pF capacitor C3 to ground, and a 220 pF capacitor C2 in series with parallel resonance circuit consisting of the inductance L1 of the coil antenna 20 and capacitor C1. The output impedance of the power circuit 2 that is driving the capacitive network that powers antenna 20 is approximately 5 ohm in parallel with 1200 pF, or approximately 3.3 ohm at the 13.56 MHz operating frequency of the output carrier signal 110. This is sufficiently low for driving a parallel tuned antenna 20 through the capacitive circuit C2, C3 without excessively loading the Q factor of the power circuit 2. FIG. 9 illustrates the output signal 112 tuned to a sine wave utilizing the variable capacitor, C1 shown in FIG. 1.

Although a preferred embodiment of the invention has been described above by way of example only, it will be understood by those skilled in the field that modifications may be made to the disclosed embodiment without departing from the scope of the invention, which is defined by the appended claims.

I claim:

1. A power oscillator for controlling the wave shape and amplitude of an input signal to produce a desired output signal, the circuit comprising:
   a tapped delay line connected to the input signal, the tapped delay line having a plurality of taps, each tap separated from an adjacent tap to produce a plurality of delayed input signals;

at least one buffer, the buffer comprising:
a plurality of input lines connected to the plurality of taps;
an input voltage line for connection to a controllable voltage source; and
a plurality of output lines; and
a plurality of resistors having first ends connected to the plurality of output lines, the plurality of resistors having second ends connected in parallel to an output node to produce the desired output signal.

2. The power oscillator of claim 1, wherein the buffer is a complementary metal-oxide semiconductor (CMOS).

3. The power oscillator of claim 1, wherein the desired output signal is coupled to an antenna coil of a smart card.

4. The power oscillator of claim 3, wherein the desired output signal is coupled through a capacitor circuit to the antenna coil, the capacitor circuit comprising:
at least one capacitor for providing capacitive loading; and
an adjustable capacitor for tuning the desired output signal.

5. The power oscillator of claim 1, where in the input signal is 100% amplitude (on/off) modulated.

6. The power oscillator of claim 5, wherein the input signal is a square wave carrier signal.

7. The power oscillator of claim 1, wherein the tapped delay line comprises a stripline embedded in a circuit board.

8. The power oscillator of claim 1, wherein the controllable voltage source limits the operating voltage of the buffer to produce an amplitude modulation less than 100%.

9. A method for shaping and controlling the amplitude of a carrier signal, the method comprising the steps of:
inputting the carrier signal into a tapped delay line having a plurality of taps separated by a plurality of delay distances;
connecting each tap of the plurality of taps to a buffer of a plurality of buffers;
connecting a series resistor to an output of each buffer of the plurality of buffers;
connecting the outputs and series resistors of each buffer in parallel to a single node to produce a shaped carrier signal; and
supplying a supply voltage to the buffers to control an output voltage amplitude of the shaped carrier signal.

10. The method of claim 9, wherein the plurality of delay distances are equal.

11. The method of claim 10, wherein the carrier signal is a square wave having a 50% duty cycle, and wherein the shaped carrier signal is trapezoidal.

12. The method of claim 9, wherein the series resistor connected at the output of each buffer is 82 ohms.

13. The method of claim 9, further comprising the step of adding capacitive loading to the single node.

14. The method of claim 13, further comprising the step feeding the shaped carrier signal to an antenna tuned to the operating frequency of the carrier signal.

15. The method of claim 9, wherein the plurality of buffers are contained in CMOS line driver packages.

16. The method of claim 9, wherein the step of supplying a supply voltage to the buffers further comprises the steps of modulating the voltage of the power supply circuit resulting in a directly proportional modulation of the antenna field in accordance with the desired percent modulation.

17. The method of claim 16, wherein the desired percent modulation is between 0 and 25% modulation and the supply voltage is at a level of 5 volts.

18. The method of claim 16, wherein the desired percent modulation is between 0 and 25% modulation and the supply voltage is at a level of 3.3 volts, using CMOS buffers operating at 3.3V.

19. The method of claim 9, wherein the plurality of delay distances are not equal, and the resulting shaped carrier signal is sinusoidal.

* * * * *